US006756683B2

United States Patent
Kunihisa et al.

(10) Patent No.: US 6,756,683 B2
(45) Date of Patent: Jun. 29, 2004

(54) HIGH-FREQUENCY SEMICONDUCTOR DEVICE INCLUDING A SEMICONDUCTOR CHIP

(75) Inventors: Taketo Kunihisa, Neyagawa (JP); Toshihide Nobusada, Ibaraki (JP); Kazuhiro Yahata, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/122,514

(22) Filed: Apr. 15, 2002

(65) Prior Publication Data

US 2002/0153616 A1 Oct. 24, 2002

(30) Foreign Application Priority Data

Apr. 20, 2001 (JP) .......................... 2001-122460

(51) Int. Cl.⁷ .............................................. H01L 23/48
(52) U.S. Cl. ..................... 257/778; 257/784; 257/774; 257/690
(58) Field of Search ................. 257/690, 692, 257/767, 774, 778, 784, 78

(56) References Cited

U.S. PATENT DOCUMENTS 5,639,683 A * 6/1997 Reyes .................... 438/107
6,384,701 B1 * 5/2002 Yamada et al. ........... 333/247

FOREIGN PATENT DOCUMENTS

JP 2000232212 * 8/2000

* cited by examiner

Primary Examiner—Nathan J. Flynn
Assistant Examiner—Leonardo Andújar

(57) ABSTRACT

A semiconductor device includes a silicon substrate with a resistivity being raised by diffusing Au etc. therein, and includes both active elements and passive elements. The active elements are all placed within a semiconductor chip, and the semiconductor chip is flip-chip mounted over the silicon substrate. Such a case where the silicon substrate is heated due to a heating process for forming the active elements can be avoided, and therefore, diffusion of Au etc. from the silicon substrate into the semiconductor device can be avoided.

9 Claims, 3 Drawing Sheets

HIGH-FREQUENCY SEMICONDUCTOR DEVICE INCLUDING A SEMICONDUCTOR CHIP

BACKGROUND OF THE INVENTION

1. Field of the Invention

The present invention relates to a semiconductor device, and particularly to a high-frequency semiconductor device for use in microwave communication, millimeter wave communication, and the like.

2. Related Art

In recent years, wireless communication devices that have rapidly become widespread, such as mobile telephones, tend to utilize microwave waveband or millimeter waveband. To process such high-frequency signals, research and development are being made of various techniques in the field of semiconductors. As one example of such techniques, a high-frequency device incorporates a matching circuit for getting the performance of an active element included in the device. Like this combination of an active element and a matching circuit, the MMIC (MonolithicMicrowave IC) technique is an example for integrating active elements and passive elements into one semiconductor device.

According to the MMIC technique, active elements and passive elements are formed on the same chip. Here, using for example a GaAs substrate with a high resistivity of about several tens MΩ·cm can lower loss of passive elements (a spiral inductor, a transmission line, etc.). On the other hand, the use of a silicon substrate, which is cheaper than a GaAs substrate, cannot lower loss of passive elements because the silicon substrate has a low resistivity.

FIG. 1 is a graph showing the relationship between a resistivity (Ω·cm) of a substrate and a loss (dB/m) per unit length of an Au wire, when the Au wire with a thickness of 3 μm and a width of 70 μm is laid on an oxide film with a thickness of 0.2 μm formed on the substrate. It should be noted here that the Au wire constitutes a transmission line with a resistivity of 50 Ω.

As FIG. 1 shows, a line loss varies depending on a frequency of a signal applied on the line. A lowering rate of the line loss is substantially saturated when the resistivity is around 100 kΩ·cm. With the resistivity being raised above this value, the line loss is not drastically lowered any more. On the other hand, according to the single-crystal silicon formation technique presently being available, a resistivity of a silicon substrate has its maximum at about several kΩ·cm, and so the present technique fails to form a silicon substrate having a resistivity higher than several kΩ·cm.

In view of this difficulty, a semiconductor device disclosed in Japanese published unexamined application No. 2000-232212 is proposed as one example. FIG. 2 is a cross sectional view of the semiconductor device relating to the disclosure. As FIG. 2 shows, the semiconductor device 1 includes a silicon substrate 101 having a high resistivity achieved by diffusing Au therein. On the top surface of the silicon substrate 101, an oxide film 102 is formed.

An SOI (Silicon On Insulator) layer 103 made of single-crystal silicon is embedded in the oxide film 102. A source region 104 and a drain region 105 are provided each adjacent to the SOI layer 103. The source region 104 and the drain region 105 are formed by impurities injected into the oxide film 102. On the SOI layer 103, a gate insulation film 106 is formed. Within the gate insulation film 106, a gate electrode 107 is formed. In the remaining region on the oxide film 102, an interlayer insulation film 108 is formed.

Above the source region 104 and the drain region 105, contact holes 109 and 110 are respectively formed so as to pierce the inter layer insulation film 108. The contact holes 109 and 110 are filled with tungsten 111 and 112, to provide interlayer connection wires. On the interlayer insulation film 108, aluminum wires 113 and 114 are laid. These aluminum wires 113 and 114 are electrically connected to the source region 104 and the drain region 105 respectively, via the interlayer connection wires.

The interlayer insulation film 108, and the aluminum wires 113 and 114 are covered with a wire protection film 115, to prevent short circuit and the like. The wire protection film 115 is, for example, a nitride film, an oxide film, or the like. In this semiconductor device 1, a resistivity of the silicon substrate 101 is raised with the above-mentioned use of Au being diffused therein. Therefore, loss of passive elements can be lowered even though an expensive GaAs substrate is not used.

In the semiconductor device 1, however, a countermeasure should be taken for preventing diffusion of Au atoms from the silicon substrate 101 into the SOI layer 103. For this purpose, the oxide film 102 needs to be formed considerably thick, for example as thick as 2 μm. Forming such a thick oxide film increases the manufacturing cost, and therefore, the above conventional technique can be considered unpractical.

Also, in the semiconductor device 1, passive elements and active elements are both formed on the silicon substrate 101. This means that any defect occurring in an active element causes the entire semiconductor device including the passive element part to be rejected as defective, thereby degrading the manufacturing yield.

Further, passive elements, in particular a spiral inductor, occupy a large area of the substrate when being mounted onto the substrate. Considering this, the substrate with conforming passive elements being rejected only due to a defective active element is by no means favorable.

SUMMARY OF THE INVENTION

In view of the above problems, the object of the present invention is to provide a high-frequency semiconductor device at low cost and with high manufacturing yield, while lowering loss of passive elements.

The above object of the present invention can be achieved by a semiconductor device including: a silicon substrate that contains at least one of Au, Pt, and Cu in a state of being diffused, and on which a first circuit element is formed without a heating process; and a semiconductor chip in which a second circuit element is formed by a heating process, the semiconductor chip being flip-chip mounted to the silicon substrate.

According to this structure, such a case where the silicon substrate is heated due to a heating process for forming the active elements can be avoided. Therefore, diffusion of Au atoms present in the silicon substrate into other parts of the semiconductor device, in particular into the active elements, can be avoided. Therefore, a thick oxide film employed by the above conventional technique does not need to be provided, contributing to decreasing cost of the substrate and to downsizing the device.

BRIEF DESCRIPTION OF THE DRAWINGS

These and other objects, advantages and features of the invention will become apparent from the following description thereof taken in conjunction with the accompanying drawings that illustrate a specific embodiment of the invention.

In the drawings.

DESCRIPTION OF THE PREFERRED EMBODIMENTS

The following describes a preferred embodiment of the present invention, with reference to the drawings.

Figure 1:
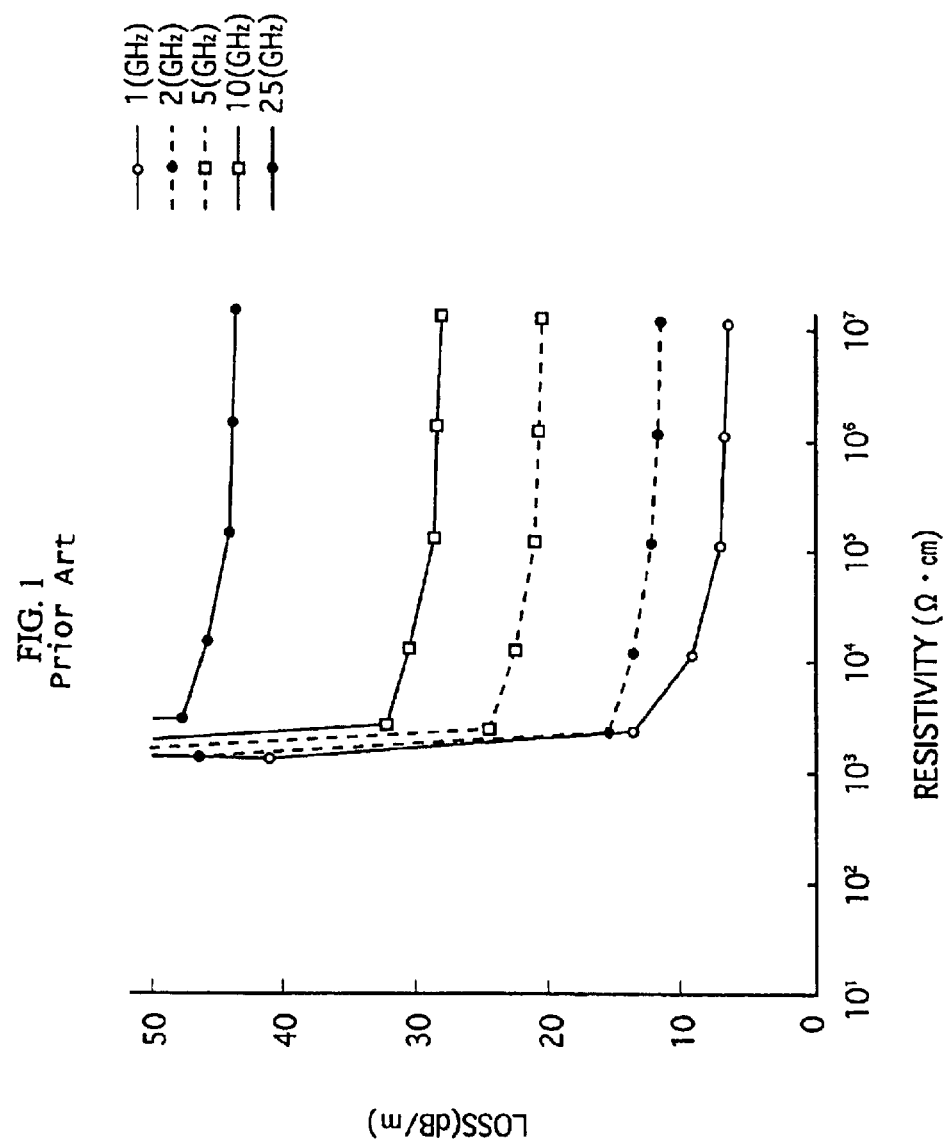
FIG. 1 is a graph showing the relationship between a resistivity of a substrate and a loss of a transmission line, being plotted for various frequencies of applied signals.
Figure 2:
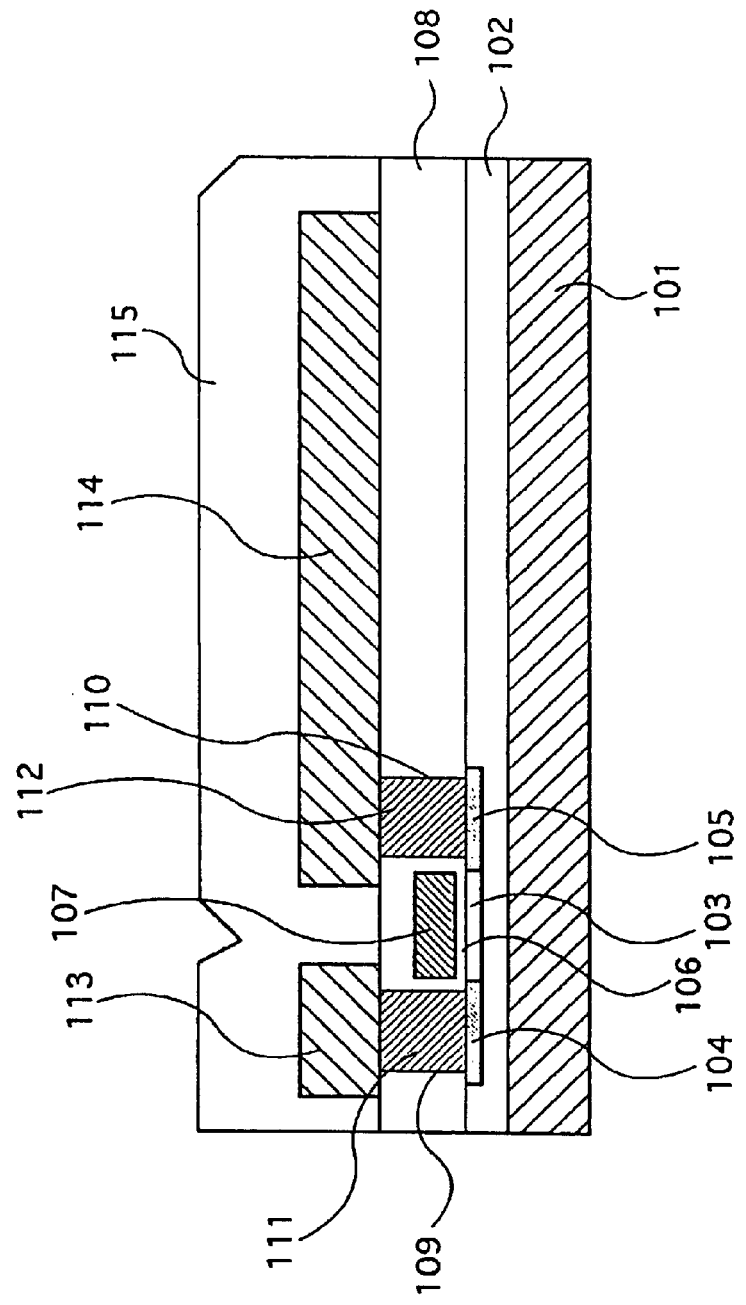
FIG. 2 is a cross sectional view of a semiconductor device relating to a conventional technique disclosed in a published unexamined application.
Figure 3:
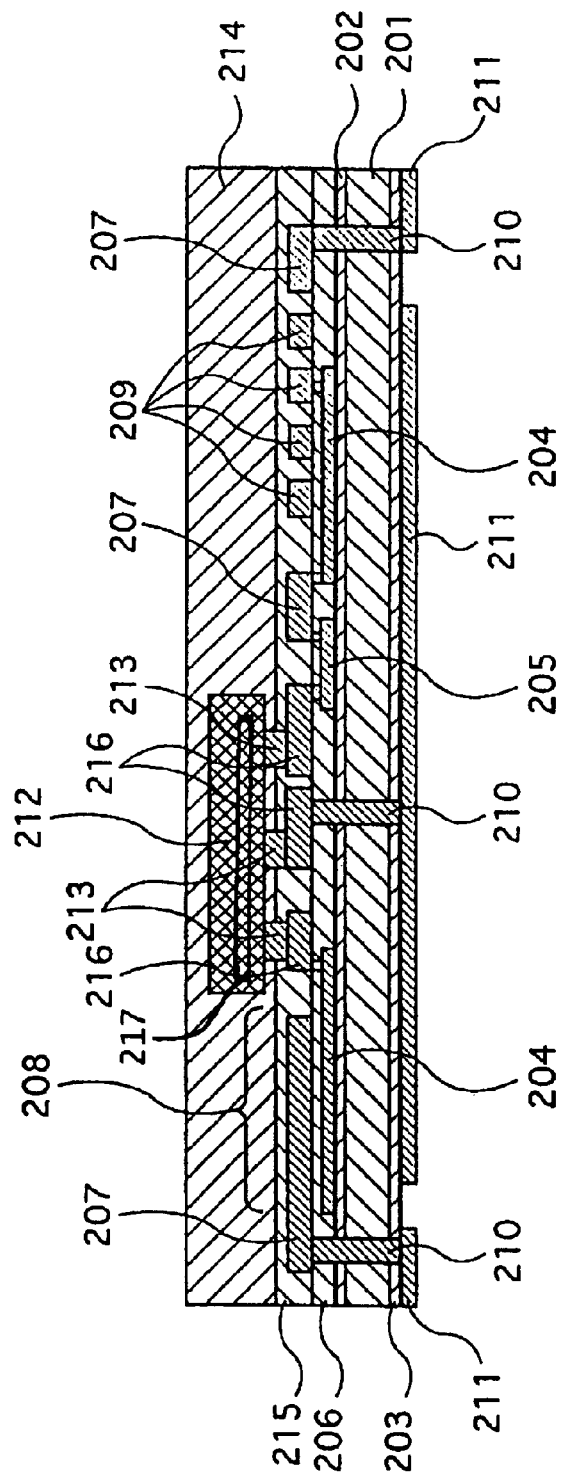
FIG. 3 is a cross sectional view of a semiconductor device relating to a preferred embodiment of the present invention.

FIG. 3 is a cross sectional view of a semiconductor device relating to the present embodiment. In FIG. 3, the semiconductor device 2 includes a silicon substrate 201 as a semiconductor substrate. The silicon substrate 201 is obtained by forming an Au film with a thickness of 1000 Å by vacuum deposition on one main surface of an n-type (phosphor diffusion) silicon substrate with a resistivity of 50 Ω, and heating the substrate with the Au film at 1050° C. for one hour to thermally diffuse Au atoms present in the Au film into the silicon substrate. A resistivity of the silicon substrate 201 is 150 kΩ·cm.

On one main surface of this silicon substrate 201, a silicon oxide film 203 with a thickness of 2000 Å is formed. On the silicon oxide film 203, back electrodes 211 are formed. Also, on the other main surface of the silicon substrate 201, a silicon nitride film 202 with a thickness of 2000 Å is formed. On the silicon nitride film 202, first layer wires 204 each formed by laminating a Ti layer, an Au layer, and a Ti layer, and a thin-film resistor 205 made of WSi (tungsten silicide) are formed. Because the silicon substrate 201 is not an insulator though its resistance is being raised, the silicon nitride film 202 is provided as an insulation film, for the purpose of preventing line loss caused by current leakage from the first layer wires 204, and the like.

The silicon nitride film 202, the first layer wires 204, and the thin-film resistor 205 are covered with a silicon nitride film 206 with a thickness of 3000 Å. On the silicon nitride film 206, second layer wires 207, a spiral inductor 209, and electrodes 216 are formed. Each of the second layer wires 207, the spiral inductor 209, and the electrodes 216 is 5 µm thick, and is formed by laminating a Ti layer and an Au layer in the stated order as closer to the silicon nitride film 202.

The silicon substrate 201 has via-holes 210 each with a diameter of 70 µm. Metal filled in the via-holes 210 function as interlayer connection wires. The second layer wires 207 are electrically connected to the back electrodes 211 via the interlayer connection wires.

A pair 208 of the first layer wire 204 and the second layer wire 207 that are positioned opposed to each other constitutes an MIM capacitor (Metal-Insulator-metal Capacitor). The spiral inductor 209 is a spirally wound wire as viewed from a plane parallel to the substrate, and is connected to the first layer wire 204 within the layer at the center vicinity. In the semiconductor device 2, semiconductor layers that include only passive elements, such as the thin-film resistor 205, the MIM capacitor 208, and the spiral inductor 209 and that do not include any active elements are laminated.

Because the silicon substrate 201 has a high resistivity (150 kΩ·cm) as described above, conductivity loss of the passive elements is low. Here, considering conductivity loss, of the passive elements, it is preferable that a resistivity of the silicon substrate 201 is at least 10 kΩ·cm. Also, the number of semiconductor layers including only passive elements is not limited to two. The same effect of the present invention can be obtained when one or more such semiconductor layers are laminated.

Here, the second layer wires 207 and the spiral inductor 209 are covered with a silicon nitride film 215. The electrodes 216 are also each covered with the silicon nitride film 215 except one part thereof. On the part of each electrode 216 that is not covered with the silicon nitride film 215, a semiconductor chip 212 that has been manufactured separately is flip-chip mounted using solder bumps 213.

This semiconductor chip 212 is connected to the back electrode 211 via the electrode 216, using metal filled in the via-hole 210 as an interlayer connection. This interlayer connection can reduce a stray inductance and its variety, compared with a case where the semiconductor chip 212 is connected to the back electrode 211 using an external wire.

Also, an SiGe-HBT 217 that is an active element, has been formed in the semiconductor chip 212. Here, the SiGe-HBT 217 is a hetero-bipolar transistor using a silicon germanium material as a base layer. The semiconductor chip 212 and the silicon nitride film 215 are covered with a sealing resin 214.

With this structure, when active elements for the semiconductor device 2 are formed, only the semiconductor chip 212 is subject to a heating process, without simultaneously subjecting the silicon substrate 201 to the heating process. Therefore, diffusion of Au atoms from the silicon substrate 201 into other parts of the semiconductor device 2 can be avoided. In particular, degradation of performances of active elements caused by Au atoms diffusing into the active elements can be prevented, enabling the semiconductor device with high performances and with high manufacturing yield to be realized.

Further, because the silicon substrate 201 is not heated, an embedded oxide film as thick as 2 µm employed by the above conventional technique for preventing diffusion of Au atoms does not need to be provided. A thickness of the silicon nitride film 202 may be 1 µm or less. Therefore, the manufacturing process for the semiconductor device can be simplified.

Also, it may be possible to employ the manufacturing process for first forming active elements by a heating process and then bonding the formed active elements and the silicon substrate together, instead of forming a thick oxide film as employed by the conventional technique. In this case, however, a CMP (Chemical and Mechanical Polishing) process additionally needs to be provided before the bonding process. On the other hand, according to the present invention, such a CMP process does not need to be provided, thereby enabling the semiconductor device to be manufactured at lower cost.

Moreover, according to the present invention, silicon is employed as a substrate material. Unlike a substrate made of an insulation material such as glass, quartz, sapphire, and SiC (silicon carbonate), therefore, vias that pierce the silicon substrate can be formed easily. Accordingly, as in the present embodiment, passive elements such as the second layer wire 207 can be electrically connected to the back electrodes 211 easily.

A silicon substrate is advantageous over a GaAs substrate in that a higher processing accuracy can be obtained at one tenth of a cost with a GaAs substrate. Further, using a ceramic substrate instead of the silicon substrate 201 in the construction of the present invention would require polishing because the ceramic substrate has a coarse surface. Because of its hardness, a ceramic substrate would require a high cost for such polishing. On the other hand, a silicon substrate inherently has a sufficiently flat surface, which can save a cost for such polishing.

Here, a so-called "module technique" represents a method for mounting active elements onto a resin substrate, a ceramic substrate, etc., on which a wire pattern has been formed and a chip component has been mounted. However, a resin substrate, a ceramic substrate, etc., have a coarse surface with low flatness, and further, a wire pattern cannot be formed with precise dimensions on these substrates. Therefore, semiconductor devices relating to the module technique are difficult to downsize.

Particularly, a resin substrate, a ceramic substrate, etc. have high possibility of warping and bending, thereby easily causing shifts in pad positions. Due to this, there are cases where a semiconductor chip cannot be flip-chip mounted, or where the confidence of a semiconductor chip that could be flip-chip mounted is low. On the other hand, using a silicon substrate, the present invention is free from such problems.

Here, it may be technically possible, with the above conventional technique, to first separately form the SOI layer 103 and then bond the SOI layer 103 to the silicon substrate 101, in stead of forming a thick oxide film. By doing so, the silicon substrate 101 is not subject to a heating process, and therefore, diffusion of Au atoms from the silicon substrate 101 and the like can be prevented even though a thick oxide film is not provided.

In this case, however, a process is additionally required for bonding the separately formed SOI layer 103 to the silicon substrate 101 at a predetermined position, which increases the manufacturing cost. This method is therefore not practical. On the other hand, the present invention is advantageous in that a separately manufactured semiconductor chip is flip-chip mounted, which can be achieved at a lower cost.

(Modifications)

Although the present invention has been described based on the preferred embodiment as above, it should be clear that the present invention is not limited to the above embodiment. For example, the following modifications are possible.

(1) The above embodiment describes the case where Au is diffused in the silicon substrate 201 to raise its resistivity. However, Pt, Cu, etc. may be used instead of Au. Also, the resistivity of the silicon substrate 201 can be raised when a combination of the above elements is diffused in the silicon substrate, just as the case where only Au is diffused.

(2) Also, the above embodiment describes the case where the semiconductor chip 212 is connected to the electrodes 216 using the solder bumps 213. However, when bumps made of other materials, e.g. Au bumps, are used, the same effect of the present invention can be obtained. In this case, it should be noted here that, at the time of flip-chip mounting, the Au bumps are attached to the semiconductor chip after the heating process of the semiconductor chip is completed. Therefore, diffusion of Ag atoms form the Au bumps into the semiconductor chip does not occur.

(3) Also, the above embodiment describes the case where an active element used in the semiconductor chip is an SiGe-HBT. However, the same effect of the present invention can be obtained when any elements that are formed by a heating process are mounted in the semiconductor chip. This is because the present invention aims at preventing diffusion of Au atoms from the silicon substrate into other parts of the semiconductor device, in particular into active elements, by avoiding such a case where the silicon substrate is heated simultaneously when a heating process is performed for forming these elements.

(4) Also, the above embedment describes the case where the semiconductor chip 212 is flip-chip mounted over the same main surface of the silicon substrate 201 on which the passive elements 208 and 209, and the like, are mounted. However, the present invention is also effective when the semiconductor chip 212 is mounted over the other main surface of the silicon substrate 201 that is different from the main surface of the silicon substrate 201 on which the passive elements and the like are mounted. Considering the complexity of wiring required for the flip-chip mounting, however, it is more preferable to mount the semiconductor chip 212 over the same main surface on which the passive elements and the like are mounted.

Although the present invention has been fully described byway of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A semiconductor device, comprising:
a silicon substrate that contains at least one of Au, Pt, and Cu in a state of being diffused, and on a main surface of which a first circuit element is formed without a heating process, wherein the first circuit element formed without the heating process is a passive element;
a semiconductor chip in which a second circuit element is formed by a heating process, the semiconductor chip being flip-chip mounted onto the silicon substrate in such a manner that the semiconductor chip is spaced from the main surface of the silicon substrate; and
a metal member that is on a main surface of the silicon substrate opposite to the main surface of the silicon substrate on which the passive element is formed, the metal member being electrically connected to the passive element by a via-hole formed in the silicon substrate.

2. The semiconductor device of claim 1, wherein the at least one of Au, Pt, and Cu is thermally diffused in the silicon substrate.

3. The semiconductor device of claim 1, wherein a resistivity of the silicon substrate is 10 kΩ·cm or higher.

4. The semiconductor device of claim 1, wherein the second circuit element formed by the heating process is an active element.

5. The, semiconductor device of claim 1, wherein the, semiconductor chip is flip-chip mounted to the main surface of the silicon substrate on which the passive element is formed.

6. The semiconductor device of claim 1, further comprising an insulation film that electrically insulates the silicon substrate and the passive element, the insulation film having a thickness of 1 μm or less.

7. A semiconductor device capable of receiving high frequency signals, comprising:
a heat-treated silicon substrate containing thermally diffused Au, Pt or Cu atoms for producing a resistivity of at least 10 Ω·cm;
a silicon oxide layer formed on a first surface of the silicon substrate;
a silicon nitride layer formed on a second surface of the silicon substrate;
a passive circuit element formed without heat treatment on the silicon nitride layer; and
a semiconductor chip having an active circuit element formed with heat treatment and thereafter flip-chip mounted to the passive circuit element, the semiconductor chip being spaced apart from the silicon substrate.

8. The semiconductor device of claim 7, wherein the passive circuit element is formed by laminating a Ti layer and an Au layer to the silicon nitride layer.

9. The semiconductor device of claim 7, wherein the active circuit element is a hetero-bipolar transistor having a silicon germanium base layer.

* * * * *